(12) United States Patent
Cramer et al.

(10) Patent No.: US 10,180,628 B2
(45) Date of Patent: Jan. 15, 2019

(54) METHOD OF DETERMINING CRITICAL-DIMENSION-RELATED PROPERTIES, INSPECTION APPARATUS AND DEVICE MANUFACTURING METHOD

(71) Applicant: ASML Netherlands B.V., Veldhoven (NL)

(72) Inventors: Hugo Augustinus Joseph Cramer, Eindhoven (NL); Arie Jeffrey Den Boef, Waalre (NL); Henricus Johannes Lambertus Megens, Waalre (NL); Maurits Van Der Schaar, Eindhoven (NL); Te-Chih Huang, Hsinchu (TW)

(73) Assignee: ASML Netherlands B.V., Veldhoven (NL)

( * ) Notice: Subject to any disclaimer, the term of this patent is extended or adjusted under 35 U.S.C. 154(b) by 8 days.

(21) Appl. No.: 14/892,176

(22) PCT Filed: May 23, 2014

(86) PCT No.: PCT/EP2014/060625
§ 371 (c)(1),
(2) Date: Nov. 18, 2015

(87) PCT Pub. No.: WO2014/198516
PCT Pub. Date: Dec. 18, 2014

(65) Prior Publication Data
US 2016/0116849 A1    Apr. 28, 2016

Related U.S. Application Data

(60) Provisional application No. 61/834,105, filed on Jun. 12, 2013.

(51) Int. Cl.
*G03F 7/20* (2006.01)

(52) U.S. Cl.
CPC ...... *G03F 7/70133* (2013.01); *G03F 7/70625* (2013.01); *G03F 7/70683* (2013.01)

(58) Field of Classification Search
None
See application file for complete search history.

(56) References Cited

U.S. PATENT DOCUMENTS

| | | | |
|---|---|---|---|
| 7,352,453 B2 | 4/2008 | Mieher et al. | |
| 7,599,064 B2 | 10/2009 | Mos et al. | |

(Continued)

FOREIGN PATENT DOCUMENTS

| | | |
|---|---|---|
| EP | 1 628 164 | 2/2006 |
| JP | 2006-515958 | 6/2006 |

(Continued)

OTHER PUBLICATIONS

Christopher P. Ausschnitt, "A New Approach to Pattern Metrology," Proc. of SPIE, vol. 5375, pp. 51-65 (May 24, 2004).

(Continued)

*Primary Examiner* — Michelle M Iacoletti
(74) *Attorney, Agent, or Firm* — Pillsbury Winthrop Shaw Pittman LLP

(57) ABSTRACT

A method of determining a critical-dimension-related property, such as critical dimension (CD) or exposure dose, includes illuminating each of a plurality of periodic targets having different respective critical dimension biases, measuring intensity of radiation scattered by the targets, recognizing and extracting each grating from the image, determining a differential signal, and determining the CD-related property based on the differential signal, the CD biases and knowledge that the differential signal approximates to zero at a 1:1 line-to-space ratio of such periodic targets. Use of the determined CD-related property to control a lithography apparatus in lithographic processing of subsequent sub- (Continued)

strates. In order to use just two CD biases, a calibration may use measurements on a "golden wafer" (i.e. a reference substrate) to determine the intensity gradient for each of the CD pairs, with known CDs. Alternatively, the calibration can be based upon simulation of the sensitivity of intensity gradient to CD.

21 Claims, 12 Drawing Sheets

(56) References Cited

U.S. PATENT DOCUMENTS

| | | | |
|---|---|---|---|
| 7,791,727 | B2 | 9/2010 | Den Boef et al. |
| 8,035,824 | B2 | 10/2011 | Ausschnitt |
| 8,339,595 | B2 | 12/2012 | Den Boef |
| 8,411,287 | B2 | 4/2013 | Smilde et al. |
| 9,081,303 | B2 | 7/2015 | Cramer et al. |
| 9,110,385 | B2 | 8/2015 | Den Boef |
| 9,140,998 | B2 | 9/2015 | Smilde et al. |
| 2004/0190008 | A1 | 9/2004 | Mieher et al. |
| 2010/0103433 | A1 | 4/2010 | Ausschnitt |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2012/0044470 | A1 | 2/2012 | Smilde et al. |
| 2012/0120396 | A1 | 5/2012 | Kandel et al. |
| 2012/0123581 | A1 | 5/2012 | Smilde et al. |

FOREIGN PATENT DOCUMENTS

| | | |
|---|---|---|
| JP | 2007-522432 | 8/2007 |
| KR | 10-0877321 | 1/2009 |
| TW | 200616133 | 5/2006 |
| TW | 201229496 | 7/2012 |
| TW | 201232060 | 8/2012 |
| WO | 2009/078708 | 6/2009 |
| WO | 2009/106279 | 9/2009 |

OTHER PUBLICATIONS

Japanese Office Action dated Oct. 27, 2016 in corresponding Japanese Patent Application No. 2016-518897.
International Search Report dated Jul. 25, 2014 in corresponding International Patent Application No. PCT/EP2014/060625.
Korean Office Action dated Mar. 7, 2017 in corresponding Korean Patent Application No. 10-2015-7035629.
Taiwan Office Action dated Aug. 4, 2017 in corresponding Taiwan Patent Application No. 103119278.

METHOD OF DETERMINING CRITICAL-DIMENSION-RELATED PROPERTIES, INSPECTION APPARATUS AND DEVICE MANUFACTURING METHOD

CROSS-REFERENCE TO RELATED APPLICATIONS

This application is the U.S. national phase entry of PCT patent application no. PCT/EP2014/060625, which was filed on May 23, 2014, which claims the benefit of priority of US provisional application no. 61/834,105, which was filed on Jun. 12, 2013 and which is incorporated herein in its entirety by reference.

FIELD OF THE INVENTION

The present invention relates to methods and apparatus for determining critical-dimension-related properties, such as critical dimension (CD) or dose, of structures produced by a lithographic process usable, for example, with pupil-plane detection or dark-field scatterometry in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and other specialized tools to measure CD, overlay (the accuracy of alignment of two layers in a device) and defocus of the lithographic apparatus. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g. 40 μm by 40 μm gratings and the measurement beam generates a spot that is smaller than the grating (i.e., the grating is underfilled). This simplifies mathematical reconstruction of the target as it can be regarded as infinite. However, in order to reduce the size of the targets, e.g. to 10 μm by 10 μm or less, so they can for example be positioned in amongst product features, rather than in the scribe lane, metrology has been proposed in which the grating is made smaller than the measurement spot (i.e., the grating is overfilled). Typically such targets are measured using dark-field scatterometry in which the zeroth order of diffraction (corresponding to a specular reflection) is blocked, and only higher orders processed.

Diffraction-based overlay using dark-field detection of the diffraction orders enables overlay measurements on smaller targets. These targets can be smaller than the illumination spot and may be surrounded by product structures on a wafer. Multiple targets can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating.

Advanced lithographic processes require high-quality CD metrology for yield improvement and control. This technique is useful in advanced technology nodes because of its ability to non-destructively and rapidly retrieve accurate CD information by theoretical modeling of the spectral response under measurement. Optical CD metrology requires an elegant model to describe device stack and fitting parameters, such as CD, film thickness and real and imaginary refractive indices, n and k. The most common assumption in the model is that of non-variability of the optical properties. However, if the optical properties vary across the wafer, wafer-to-wafer or lot-to-lot, this not-modeled optical variation can impact the CD accuracy and give false alarms. Additionally, as the film stacks become more complex, a larger number of floating parameters in the model are needed. The more parameters floating in the model, the most likely it is to lose CD accuracy and precision due to correlation of floating parameters.

For current scatterometry-based CD metrology, the following problems are apparent: Cross talk of floating parameters in the model; Variation in optical properties due to process stability, such as deposition temperature; No in-die capability, because the size of CD scatterometry target is too large, typically around 40 μm by 40 μm; Long calculation time of the CDs; and It is time consuming to create the scatterometer set-up recipe.

Differential techniques may be used to measure specific parameters of the lithographic process, such as overlay, focus, and lens aberration. Differential techniques help to reduce the burden of recipe creation and allow for targets smaller than the spot size of the scatterometer. Differential techniques require that the differential signal is (close to) zero at the process operating point. This is needed for an effective common mode suppression of signals due to variation of the underlying stack. One use of differential techniques is to design targets that turn asymmetric when the process is deviating from the optimal working point. Target asymmetry can be detected by measuring higher diffraction orders in the scatterometry signal. Examples are overlay and asymmetric focus targets. Another use of differential techniques is to design target pairs, being similar at the optimal working point, but deviating in response to a specific process parameter. An example is aberration sensitive target pairs.

It is a problem that targets are not available for which a difference signal is dominated by the CD variation and that are applicable to the After Develop Inspect and After Etch Inspect steps on the lithographic process.

SUMMARY

It is desirable to overcome at least some of the problems identified above in CD measurements and to improve the measurement of CD and dose. Furthermore, it would be of great advantage if this could be applied to small target structures that can be measured using the dark-field image-based technique.

According to a first aspect, there is provided a method of determining a critical-dimension-related property of a structure produced by a lithographic process, the method comprising: (a) illuminating with radiation each of at least two periodic targets with different respective critical dimension biases; (b) measuring respective intensities of radiation scattered by the at least two targets; (c) determining a differential signal from the measured intensities; (d) determining the critical-dimension-related property based on the differential signal and the at least two critical dimension biases and based on knowledge that the differential signal approximates to zero at a 1:1 line-to-space ratio of such periodic targets.

According to a second aspect, there is provided an inspection apparatus for determining a critical-dimension-related property of a structure produced by a lithographic process. An illumination system is configured to illuminate with radiation each of at least two periodic targets with different respective critical dimension biases. A detection system is configured to measure respective intensities of radiation scattered by the at least two targets. A processor is configured to determine a differential signal from the measured intensities and to determine the critical-dimension-related property based on the differential signal and the at least two critical dimension biases and based on knowledge that the differential signal approximates to zero at a 1:1 line-to-space ratio of such periodic targets.

According to a third aspect, there is provided a method of manufacturing devices wherein a device pattern is applied to a series of substrates using a lithographic process, the method including determining a critical-dimension-related property of a structure produced by the lithographic process using at least one of the substrates and using a method according to the first aspect, and controlling the lithographic process for later substrates in accordance with the result of the method of determining the critical-dimension-related property.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 4:
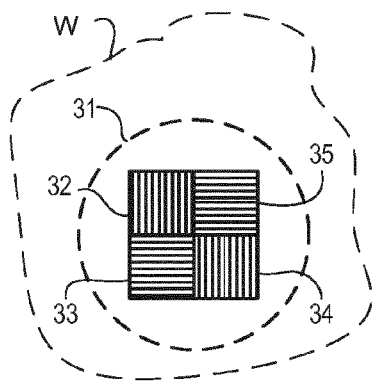
Figure 5:
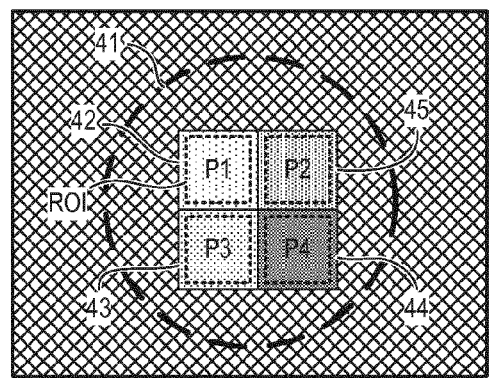
Figure 6:
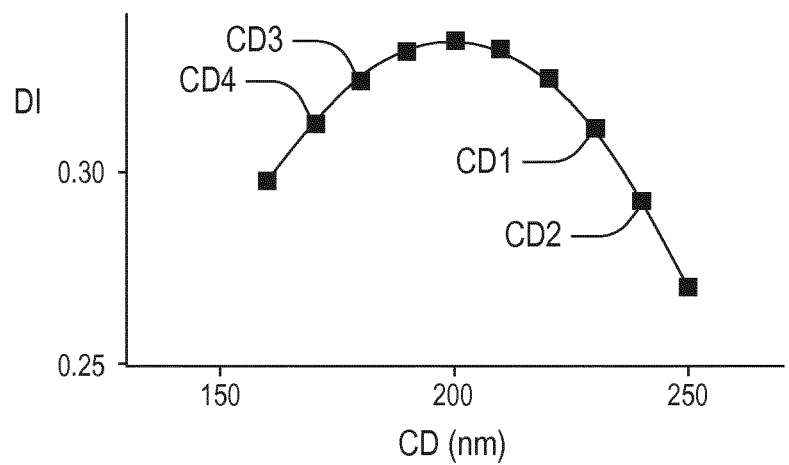
Figure 7:
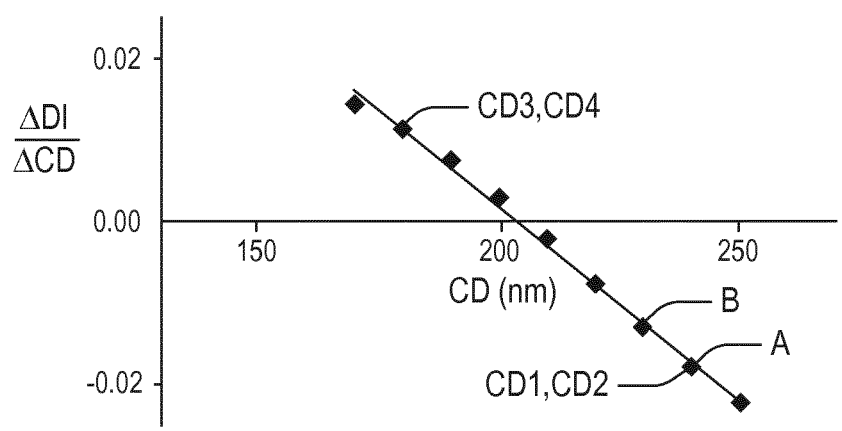
Figure 8:
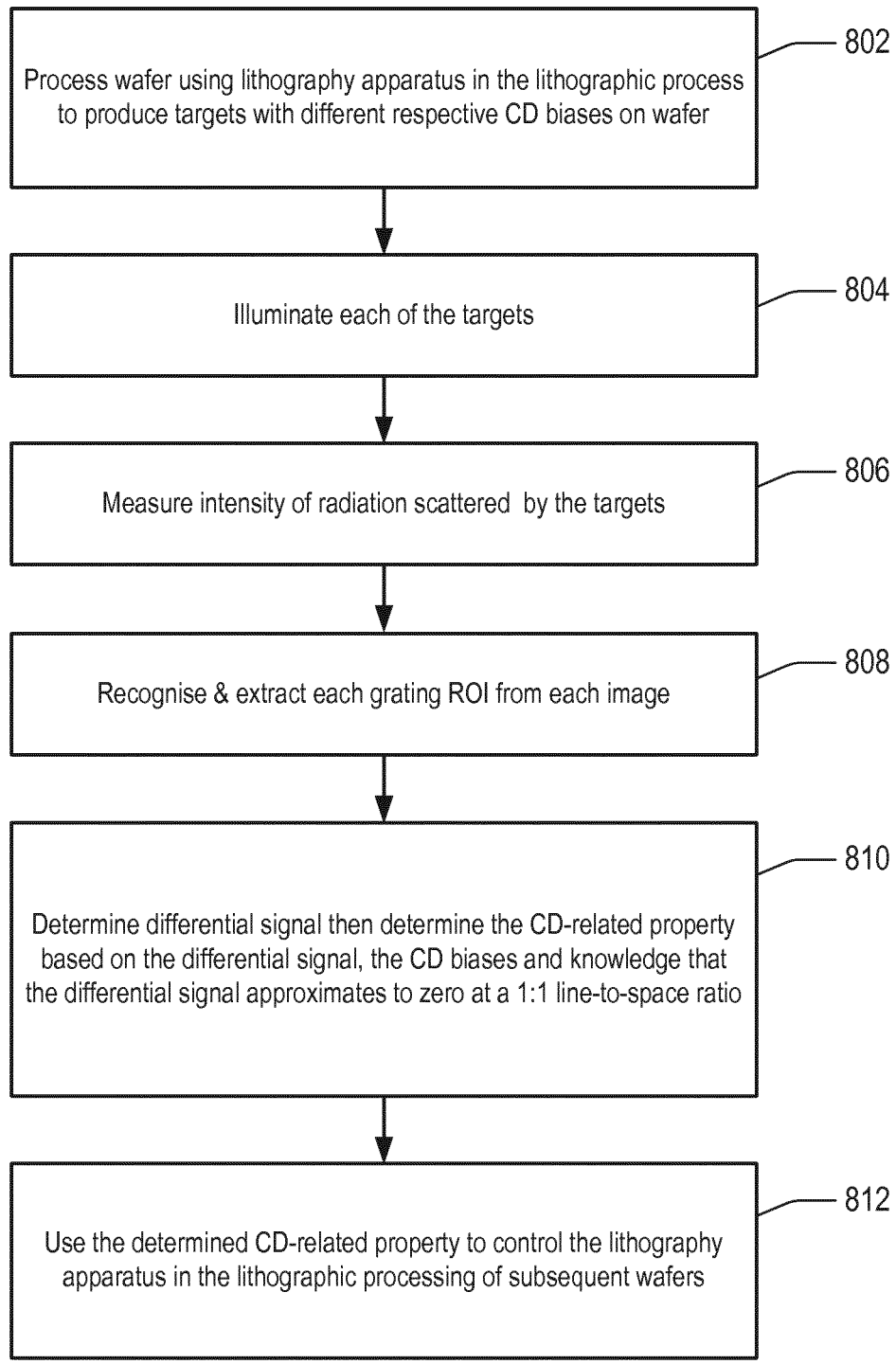
Figure 9A:
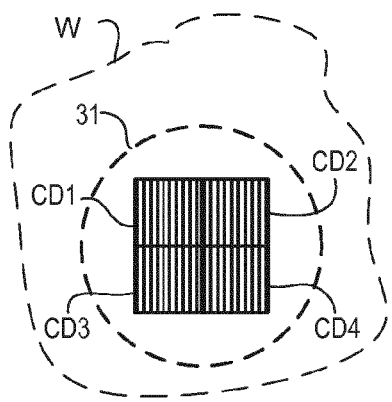
Figure 9B:
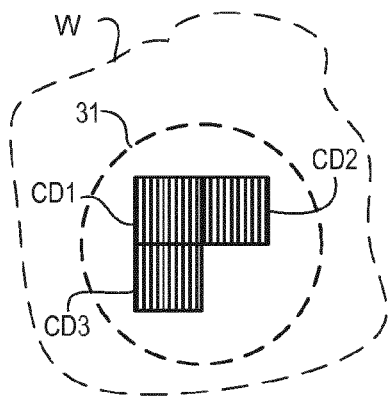
Figure 9C:
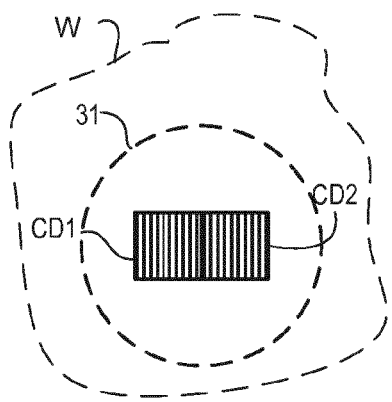
Figure 10:
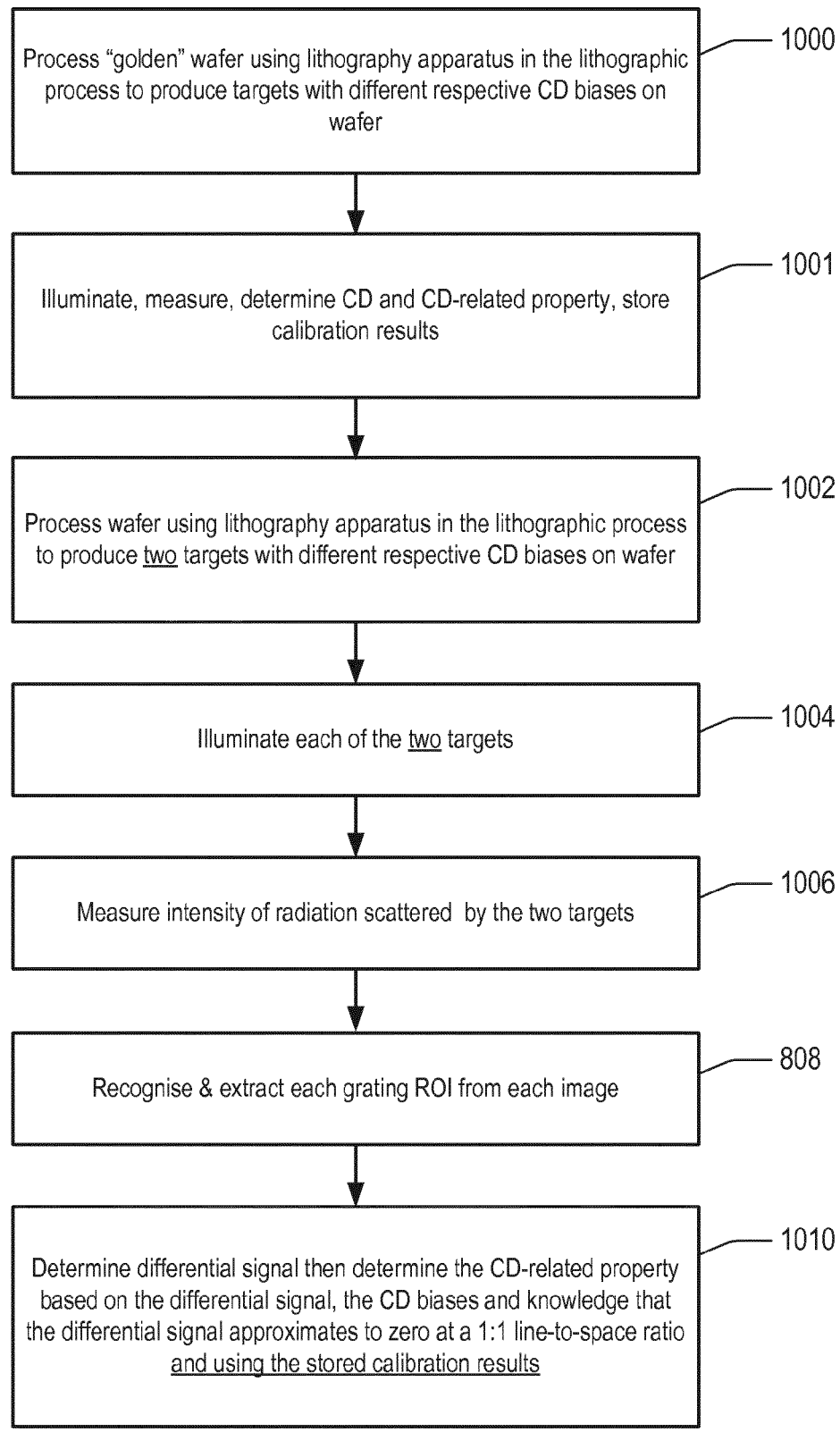
Figure 11:
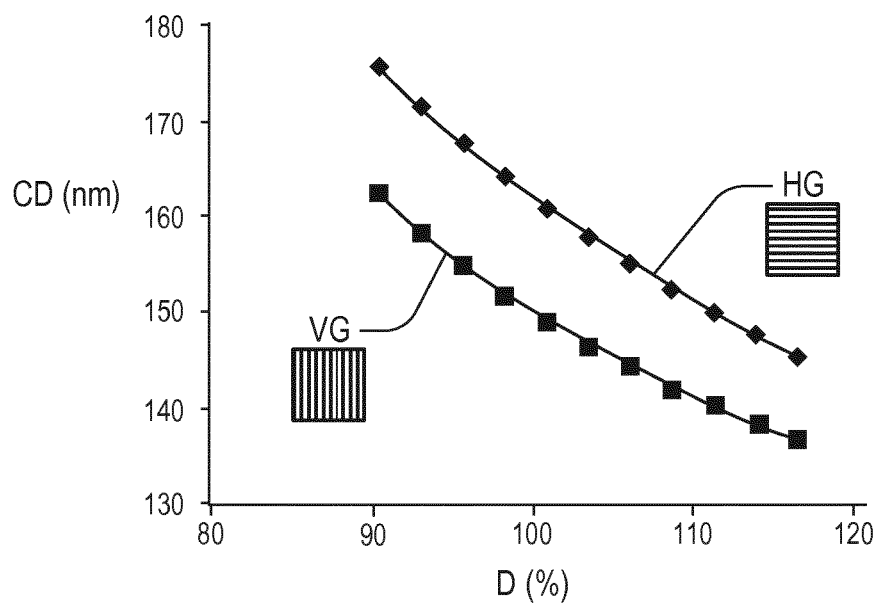

FIGS. 3A-3D comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIG. 6 is a graph of first order diffraction intensity versus CD;

FIG. 7 is a graph of gradient of first order diffraction intensity versus CD;

FIG. 8 is a flow chart of a method of determining CD and performing dose control in accordance with an example embodiment;

FIGS. 9a to 9c depict multiple grating targets with outlines of measurement spots on a substrate in accordance with example embodiments;

FIG. 10 is a flow chart of a method in accordance with an example embodiment using calibration and then using two targets to determine CD;

FIG. 11 is a graph of CD versus exposure dose for a horizontal grating and a vertical grating.

Figure 12A:
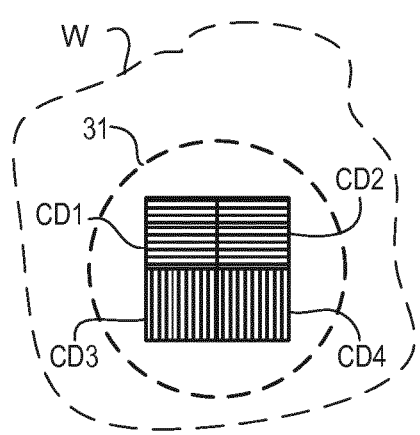
Figure 12B:
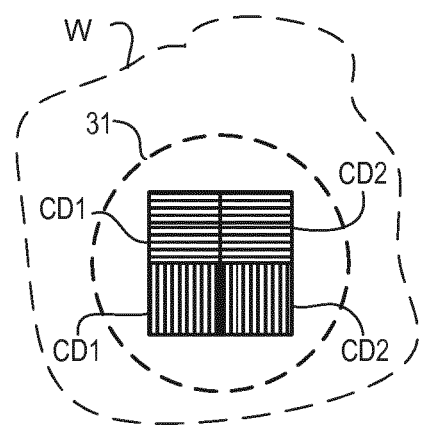
Figure 13:
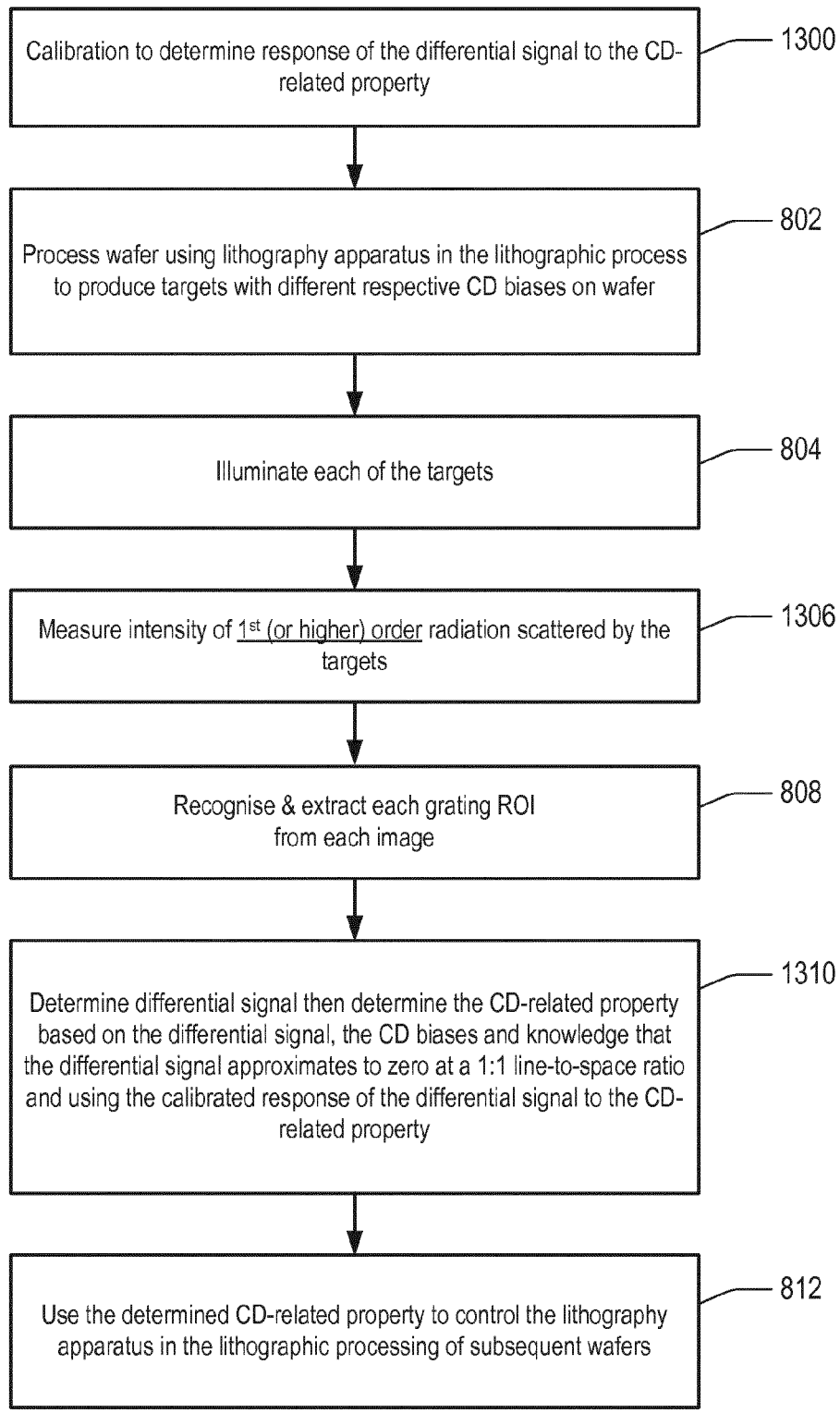
Figure 14:
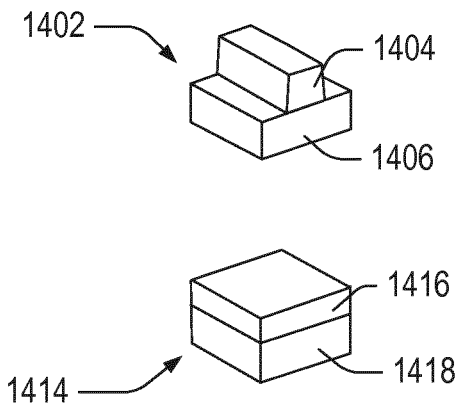
Figure 15:
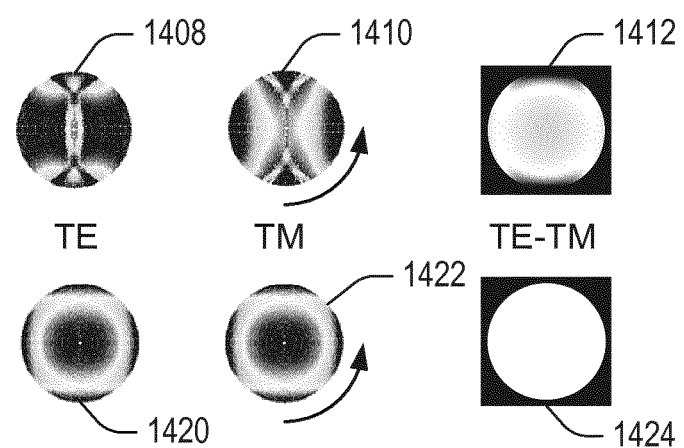
Figure 16:
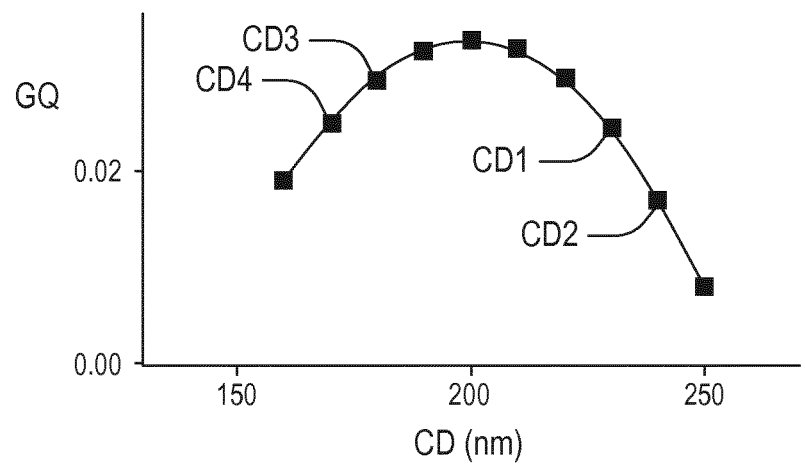
Figure 17:
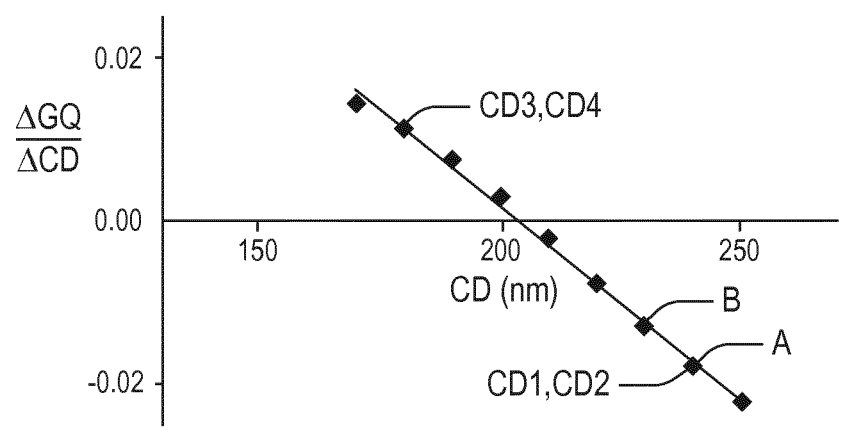
Figure 18:
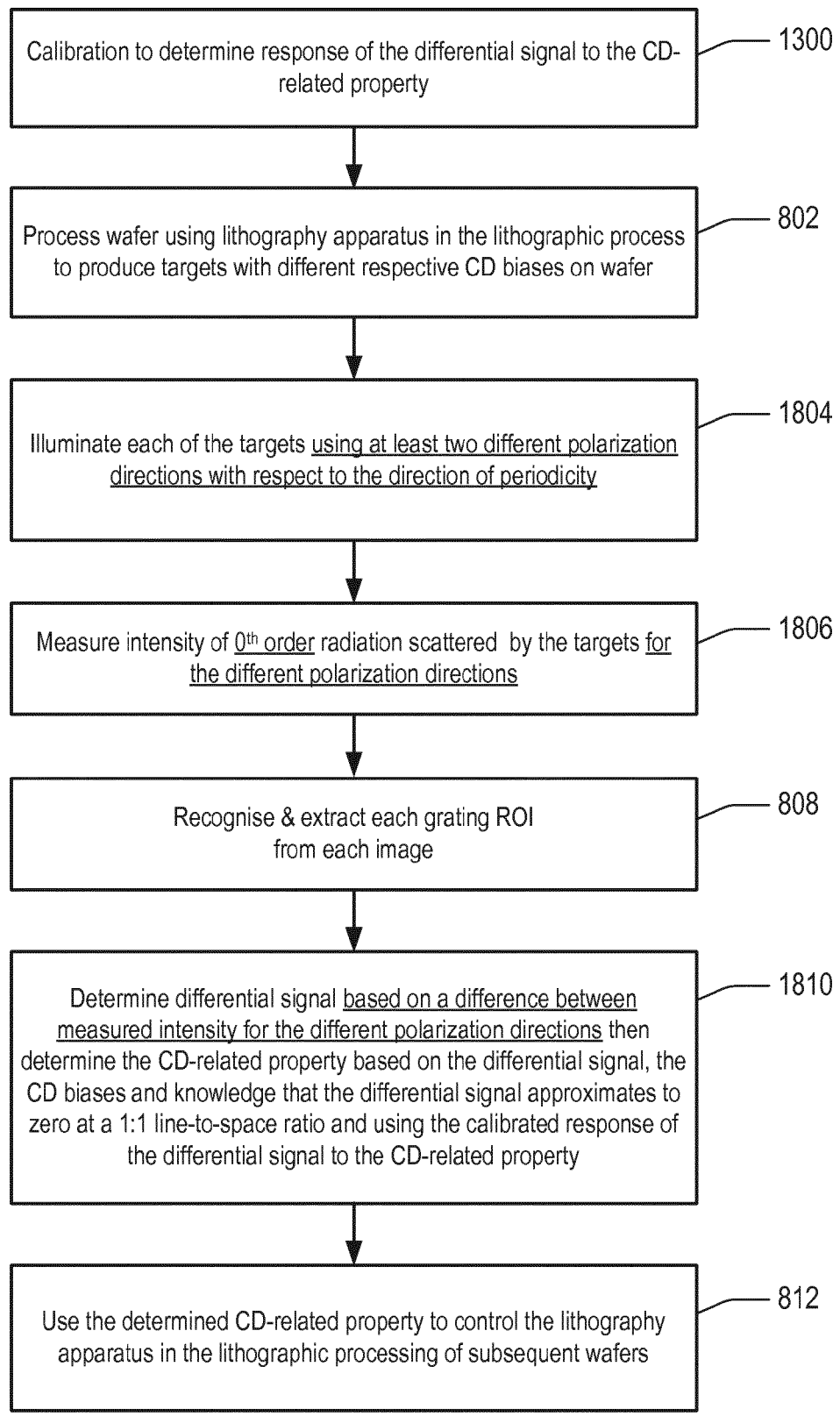
Figure 19:
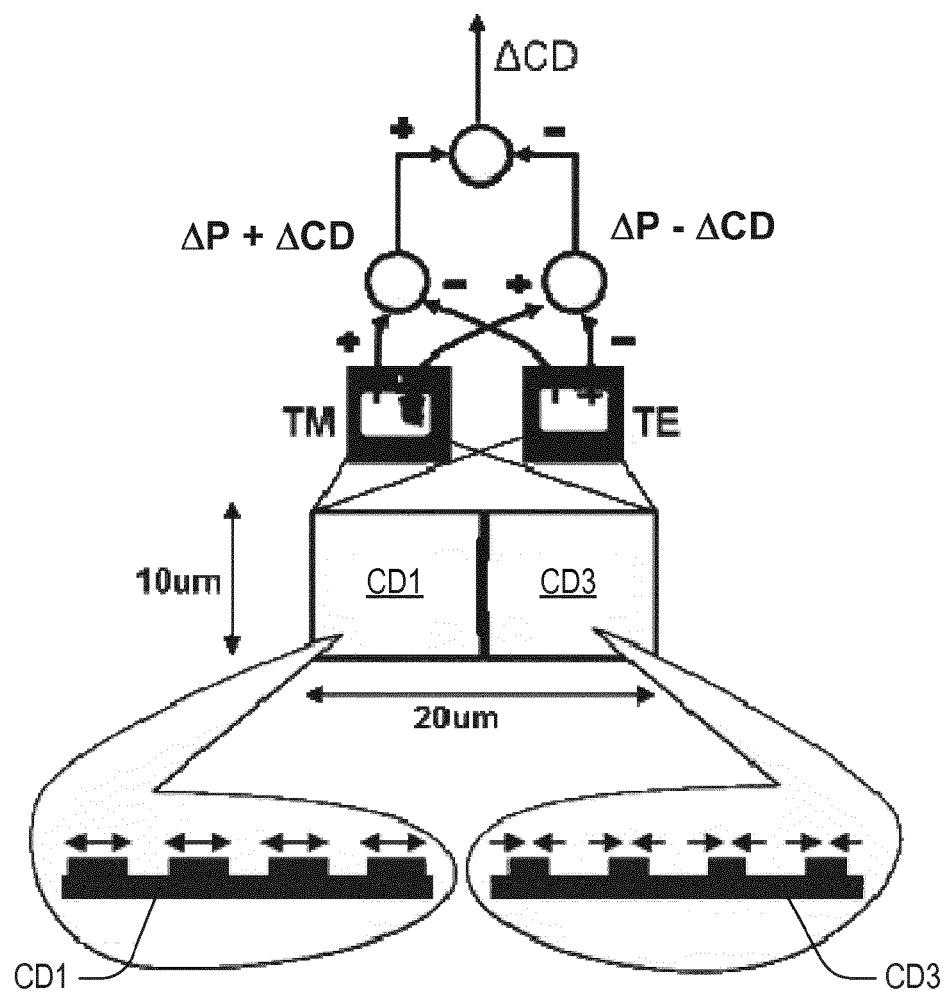

FIGS. 12a and 12b depict multiple horizontal and vertical grating targets with outlines of measurement spots on a substrate in accordance with an example embodiment;

FIG. 13 is a flow chart of a method in accordance with an example embodiment using measurement of intensity of 1st (or higher) order scattered radiation;

FIGS. 14 and 15 illustrate operation of a method of determining lithographic quality using the subtraction of different polarization pupil images as metric;

FIG. 16 is a graph of grating quality signal versus CD;

FIG. 17 is a graph of gradient of grating quality signal versus CD;

FIG. 18 is a flow chart of a method in accordance with an example embodiment using measurement of intensity of zeroth order scattered radiation; and FIG. 19 depicts an overview of determination of a double differential of grating quality.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals; and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
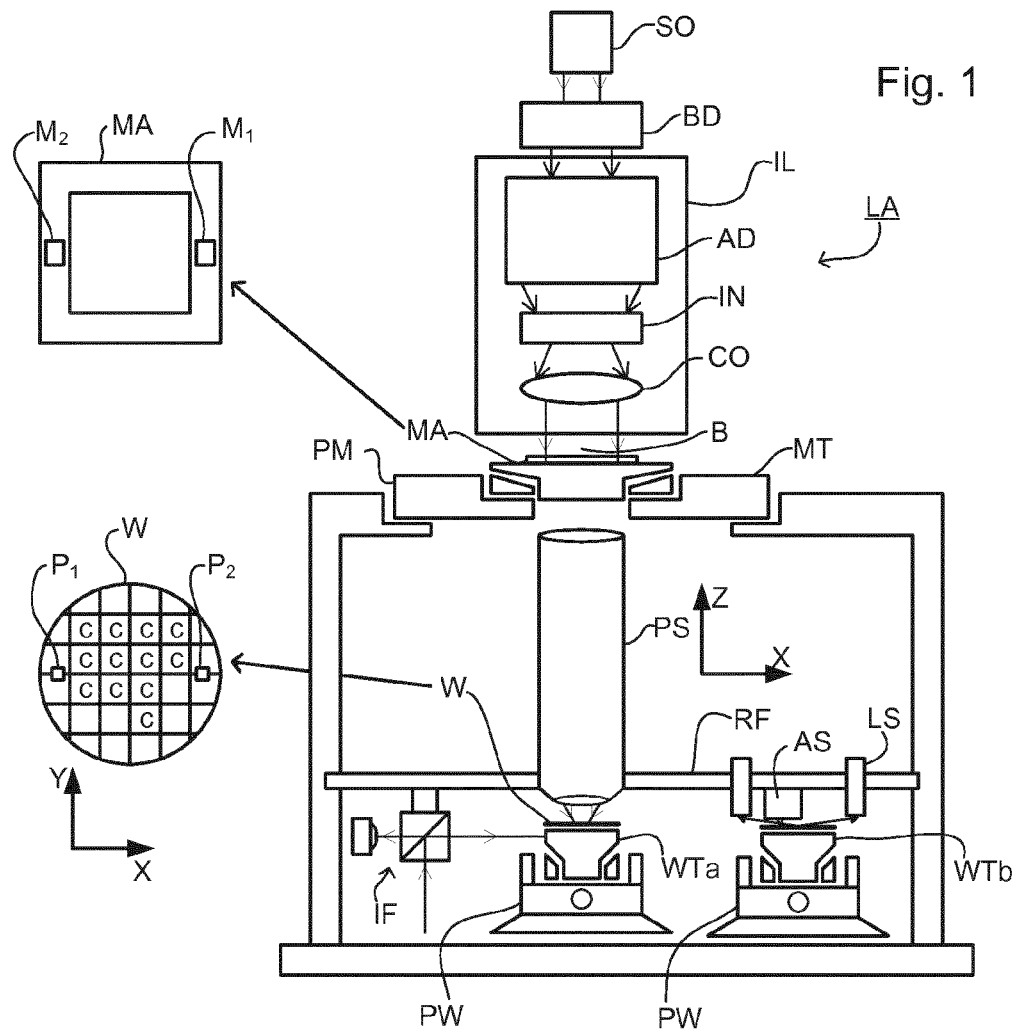
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
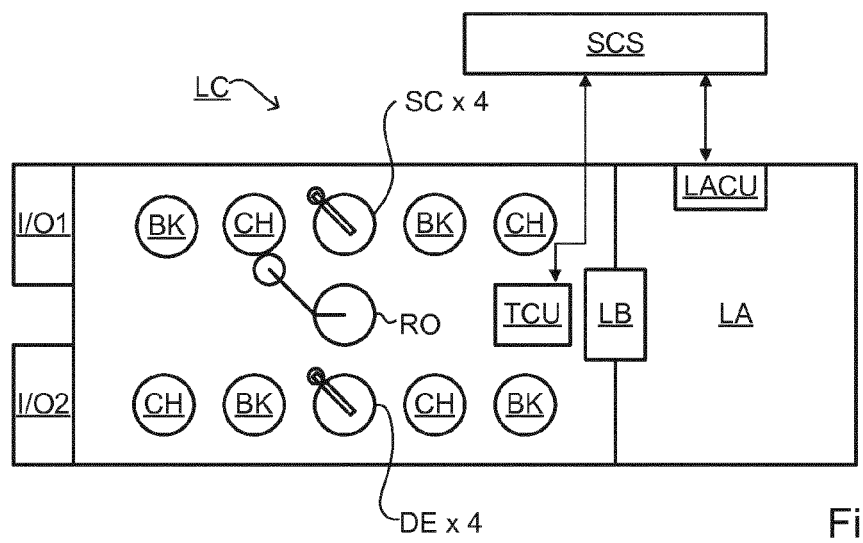
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Examples of dark-field metrology can be found in international patent applications WO 2009/078708 and WO 2009/106279, which documents are incorporated by reference herein in their entireties. Further developments of the technique have been described in patent publications US20110027704A, US20110043791A and US20120123581A. The contents of all these applications are also incorporated herein by reference in their entireties.

Figure 3B:
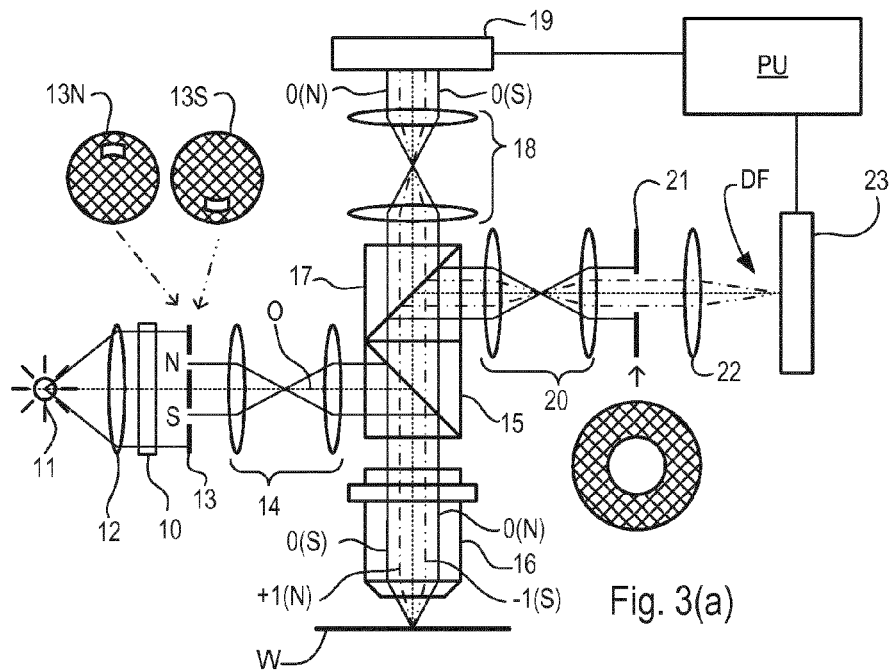
Figure 3B:
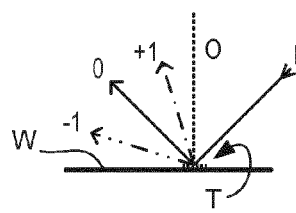

A dark field metrology apparatus suitable for use in embodiments of the invention is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

Figure 3C:
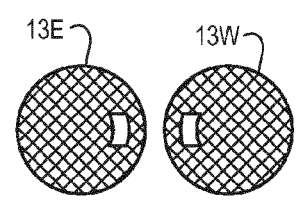

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

Figure 3D:
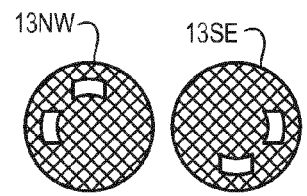

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may differ in their orientation, as shown, so as to diffract incoming radiation in X and Y directions. In one example, gratings 32 and 34 are X-direction gratings. Gratings 33 and 35 are Y-direction gratings. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process, such as focus.

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity, and (S6) to determine overlay error in the vicinity of the target T.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the methods described herein and so calculate critical-dimension-related properties. The program may optionally be arranged to control the optical system, substrate support and the like to perform the steps for measurement of a suitable plurality of target structures.

Example embodiments provide a method to extract CD by utilizing the intensity of 1st order diffraction light for a set of CD targets with different CD biases.

FIG. 6 is a graph of first order diffraction intensity DI versus CD bias. The inventors have found that a generally parabolic curve of diffraction intensity vs. CD (160 nm to 250 nm with 10 nm a step, and pitch of 400 nm) can be obtained. In this example, the peak intensity occurs at CD of 200 nm, i.e. at a 1:1 line-to-space ratio.

FIG. 7 is a graph of gradient of first order diffraction intensity with respect to CD, $\Delta DI/\Delta CD$, versus CD. $\Delta DI/\Delta CD$ is calculated by taking the difference, $\Delta DI$, between the measured 1st order diffraction intensity for each pair of CD biases (e.g. CD1, CD2 or CD4, CD3 or CD3, CD1) and dividing by the difference in CD bias, $\Delta CD$, between each of the respective pairs of CD biases. The gradient of the curve of diffraction intensity versus CD shown in FIG. 6 is increasing linearly to more negative values towards larger CD and to more positive towards smaller CD. The slope of the curve of diffraction intensity versus CD is zero at peak intensity, CD=200 nm.

By measuring the intensity gradient, the CD can be extracted when a set of CD targets with known on-wafer CD biases are used. When three or more biases are used, then the CD can be extracted directly from the measurements. When a calibration step is used, then the CD can be extracted directly from the measurements of targets with just two biases.

For example, with reference to FIG. 6, CD1=230 nm and CD2=240 nm (by design). The gradient of diffraction intensity is at position A, as shown in FIG. 7. The point A is labeled CD1, CD2 to indicate the source of the 1st order diffraction intensity measurements used to calculate the gradient at point A. When exposure dose increases, both CD1 and CD2 targets will move to smaller CDs, say CD1=220 nm and CD2=230 nm. The gradient of diffraction intensity then becomes smaller, shifting to position B, as shown in FIG. 7.

FIG. 8 is a flow chart of a method in accordance with an example embodiment, using at least three CD biases and no calibration step, having the following steps (which may not be performed in the order shown or require all the steps):

Step 802: Process a substrate (in this example a wafer) using a lithography apparatus in a lithographic process to produce periodic targets with different respective critical dimension biases on the wafer. In this example 1-D grating periodic targets are used, but periodic targets that repeat in multiple directions of periodicity, such as 2-D gratings, may also be used.

Step 804: Illuminate each of the targets. In the case of pupil-plane detection scatterometry (for example using sensor 19 in FIG. 3a), each of the targets are illuminated separately. In the case of dark-field image-plane detection scatterometry (for example using sensor 23 in FIG. 3a), each of the targets may be illuminated together.

Step 806: Measure intensity of radiation scattered by the targets. As mentioned for step 804, this may be done using pupil-plane detection scatterometry or using dark-field image-plane detection scatterometry.

Step 808: Recognise & extract each grating ROI from each image in the case of pupil-plane detection, where an image is taken for each underfilled target, or from the single image in the case of (dark-field) image-plane detection with multiple overfilled targets per image. In the case of pupil-plane detection scatterometry, gratings are detected in separate images and no recognition step may be needed, because the location of selected diffraction order intensity is predictable for each underfilled target. In the case of dark-field image-plane detection scatterometry, each of the grating images are detected together in one image and recognition is used to account for alignment inaccuracy for overfilled targets.

Step 810: Determine a differential signal from the measured intensities. Then determine the CD-related property, such as CD or exposure dose, based on the differential signal, the CD biases and knowledge that the differential signal approximates to zero at a 1:1 line-to-space ratio of such periodic targets. The critical-dimension-related property may be determined based on the measured intensity, the critical dimension biases and based on the intensity of the scattered radiation having an extremum at a 1:1 line-to-space ratio of such periodic targets.

Step 812: Use the determined critical-dimension-related property to control the lithography apparatus in the lithographic processing of subsequent wafers.

Combinations of target dimensions and scatterometer recipe may be generated to optimize the measurement performance. By selecting the optimum target design and recipe that has the least variation in intensity gradient with respect to stack layer thickness, this method can to be insensitive to stack variations. The stack variations, including slight optical property changes, can influence traditional optical CD modeling and result in false reported CD value.

Advantages of the methods described herein are: No model is needed; in-die capability is provided; it can be used for CD measurement as well as dose control; it can be immune to optical property variation; the target can be smaller; and almost no calculation time needed.

FIGS. 9a to 9c depict multiple grating composite targets with outlines of measurement spots on a substrate in accordance with example embodiments using dark-field image-plane detection scatterometry.

FIG. 9a depicts a composite target formed on a substrate according to an embodiment. The composite target comprises four gratings CD1 to CD4 positioned closely together so that they will all be within a measurement spot 31 formed by the illumination beam of the metrology apparatus. The four targets thus may be all simultaneously illuminated and simultaneously imaged on sensor 23.

FIG. 9b depicts a composite target formed on a substrate according to an embodiment. The composite target comprises three gratings CD1 to CD3 positioned closely together so that they will all be within a measurement spot 31 formed by the illumination beam of the metrology apparatus. The three targets thus may be all simultaneously illuminated and simultaneously imaged on sensor 23.

FIG. 9c depicts a composite target formed on a substrate according to an embodiment. The composite target comprises two gratings CD1 to CD2 positioned closely together so that they will both be within a measurement spot 31 formed by the illumination beam of the metrology apparatus. The two targets thus may be all simultaneously illuminated and simultaneously imaged on sensor 23.

The composite targets depicted in FIGS. 9a and 9b with four and three CD biases respectively can be used without a prior calibration step to determine CD. However, in order to use just two CD biases, a calibration step is needed. This calibration step may use three CD biases. The calibration step may use measurements on a "golden wafer" (i.e. a reference wafer) to determine the intensity gradient for each of the CD pairs, with known CDs. Alternatively, the calibration can be based upon simulation of the sensitivity of intensity gradient to CD.

FIG. 10 is a flow chart of a method in accordance with an example embodiment using such a calibration, having the following steps (which may not be performed in the order shown or require all the steps) (with the step in common with FIG. 8 labeled accordingly):

Step 1000: Process a "golden" (reference) wafer using lithography apparatus in the lithographic process to produce at least two targets with different respective critical dimension biases on wafer.

Step 1001: Illuminate, measure, determine the critical dimension and critical-dimension-related property, then store the calibration results. As an alternative to using a scatterometry measurement, the critical dimension may be measured or confirmed using other known metrology tools, such as CD-SEM. This step may be performed in accordance with the method described with reference to FIG. 8. The calibration steps 1000 and 1001 may be used to determine response of a differential signal to the critical-dimension-related property by determining the differential signal from measured respective intensities of radiation scattered by at least two targets with known critical dimensions. As an alternative to steps 1000 and 1001, a calibration step (not shown) to determine response of the differential signal to the critical-dimension-related property may involve simulation of sensitivity of the differential signal to critical dimension.

Step 1002: Process wafer using lithography apparatus in the lithographic process to produce two targets with different respective critical dimension biases on wafer.

Step 1004: Illuminate each of the two targets.

Step 1006: Measure intensity of radiation scattered by the two targets.

Step 808: Recognize and extract each grating ROI from each image in the case of pupil-plane detection, where an image is taken for each underfilled target, or from the single image in the case of (dark-field) image-plane detection with multiple overfilled targets per image.

Step 1010: Determine a differential signal from the measured intensities. Then determine the CD-related property, such as CD or exposure dose, based on the differential signal, the CD biases and knowledge that the differential signal approximates to zero at a 1:1 line-to-space ratio of such periodic targets and using the stored calibration results. The critical-dimension-related property may be determined based on the measured intensity and the two critical dimension biases and based on the intensity of the scattered radiation having an extremum at a 1:1 line-to-space ratio of the periodic targets and using the stored calibration results.

Although not shown in FIG. 10, it is possible to use the determined critical-dimension-related property to control the lithography apparatus in the lithographic processing of subsequent wafers.

The dose sensitivity of vertical and horizontal lines may not be the same due to illumination asymmetry. It is possible to combine both H-gratings (horizontal gratings) and V-gratings (vertical gratings) into a composite target for CD measurement and dose control. It is then possible to: Measure H-V CD bias and monitor its stability; measure H CD and V CD simultaneously; and cross check the measurement result between H and V.

Measurements taken from such a combined H-grating and V-grating target are illustrated in FIG. 11, which is a graph of CD (in nm) versus exposure dose D (in % of standard dose) for a horizontal grating HG and a vertical grating VG. The square next to each of the HG and VG labels is to illustrate a horizontal and vertical grating target respectively.

FIGS. 12a and 12b depict multiple horizontal and vertical grating composite targets with outlines of measurement spots on a substrate in accordance with an example embodiment;

Gratings CD1 to CD4 with different CD biases may differ in their orientation so as to diffract incoming radiation in X and Y directions. In one example, shown in FIG. 12a, gratings CD1 and CD2 are horizontal gratings (HG, periodic in the Y-direction) and gratings CD3 and CD4 are vertical gratings (VG, periodic in the X-direction). For dark-field scatterometry, separate images of these gratings can be identified in the image captured by sensor 23 with reference to FIG. 3a. In another example, shown in FIG. 12b, gratings CD1 and CD2 with different CD biases are horizontal gratings (HG) and gratings CD1 and CD2 with different CD biases are repeated as vertical gratings (VG). Again, for dark-field scatterometry, separate images of these gratings can be identified in the image captured by sensor 23.

FIG. 13 is a flow chart of a method in accordance with an example embodiment using measurement of intensity of 1st (or higher) order radiation, having the following steps (with the steps in common with FIG. 8 labeled accordingly) (which may not be performed in the order shown or require all the steps):

Step 1300: In order to use just two critical dimension biases in the following steps 802 to 1310, a calibration step is needed. This calibration step may be performed as described in steps 1000 and 1001 with reference to FIG. 10. This calibration step may use three CD biases. The calibration step may use measurements on a "golden wafer" (i.e. a reference wafer) to determine the intensity gradient for each of the CD pairs, with known CDs. Alternatively, the calibration can be based upon simulation of the sensitivity of intensity gradient to CD.

Step 802: Process wafer using lithography apparatus in the lithographic process to produce targets with different respective critical dimension biases on wafer.

Step 804: Illuminate each of the targets.

Step 1306: Measure intensity of 1st order radiation scattered by the targets. Although 1st order radiation intensity is measured in this example, the method is not limited to 1st order and other higher orders may be used, for example 2nd order, or a combination of orders.

Step 806: Recognize and extract each grating ROI from each image in the case of pupil-plane detection, where an image is taken for each underfilled target, or from the single image in the case of (dark-field) image-plane detection with multiple overfilled targets per image.

Step 1310: Determine differential signal then determine the CD-related property, such as CD or exposure dose, based on the differential signal, the CD biases and knowledge that the differential signal approximates to zero at a 1:1 line-to-space ratio of such periodic targets and (if only two critical dimension biases are being used) using the calibrated response of the differential signal to the CD-related property. The critical-dimension-related property may be determined based on the measured intensity and the critical dimension biases and based on the 1st (or higher) order intensity of the scattered radiation having a maximum at a 1:1 line-to-space ratio of such periodic targets.

Step 812: Use the determined critical-dimension-related property to control the lithography apparatus in the lithographic processing of subsequent wafers.

Lithographic quality is a measure of the printability of structures using a lithographic process. Other example embodiments, described with reference to FIGS. 14 to 19 below, uses images of zeroth order scattered radiation captured by an angularly resolved scatterometry tool to perform a fast measurement of the quality of a grating.

FIGS. 14 and 15 illustrate operation of an example method of determining lithographic quality, in this example grating quality GQ, using the results of subtraction of different polarization images as metric. FIG. 15 shows pupil-pane detection scatterometry to illustrate the principle, however dark-field image-plane detection scatterometry may be used to allow smaller targets. With reference to FIG. 14, when the radiation is diffracted by a line/space grating, a portion of which is shown 1402 with a line 1404 on a substrate 1406, the diffraction pattern that the scatterometry tool captures is polarization sensitive. Two angularly resolved scatterometer pupil spectra may be measured using two polarizations (for example the perpendicular polarizations, Transverse Electric, TE, and Transverse Magnetic, TM). With reference to FIG. 15, the resulting spectrum image 1408 for TE and 90° rotated spectrum image 1410 for TM can be subtracted one from another. A root mean square (RMS) average of the resulting difference image 1412 can be evaluated yielding an intrinsically non-zero lithographic quality value, referred to herein for this example as grating quality, GQ.

If the images have been taken on a thin film stack, a portion of which is shown 1414 with a continuous film 1416 on a substrate 1418 (thus no grating is present, but just the continuous film instead), there is no polarization sensitivity of the diffracted light. So, after measuring two angularly resolved scatterometer pupil spectra using two polarizations (for example TE and TM), the resulting spectra images 1420 and 1422 can again be subtracted one from another other and a root mean square (RMS) average of the resulting difference image 1424 will result in a value close to zero. Only image noise will make it different from zero.

If the images have been taken on a grating with a different CD, the contrast between the two polarization images will be affected, yielding an RMS result between those of the thin film and the grating with a 1:1 line-space ratio.

Thus, the magnitude of the resulting RMS, GQ, provides information of the grating quality that can be obtained with a scatterometry tool without using any model or previous knowledge of the measured structures.

The RMS average is used as a particular example, but the same principle can be applied to any printing quality metric that can be generated from the measurements performed with a scatterometry tool resulting in a discrepancy between the measured signal and the predicted signal in the absence of grating.

The "difference" between the measured intensities may be understood in the sense of "dissimilarity" or "distinction" and is not limited to the sense of mathematical subtraction. A metric in which not the mathematical difference but the mathematical division is performed would also give a valid result. In other words, the difference may be thus calculated by subtraction as described above, or by any other method for determining the dissimilarity between two signals, such as division.

The measured "difference" between spectra may be converted in order to qualify the lithographic quality. A way to obtain that conversion is to use a "threshold" of, for example, 0.02 in the RMS, although this value is stack dependent. Other procedures for calculation of the quality may be used when the method is applied to different lithographic stacks.

Note that because zeroth order scattered radiation is being used in this example embodiment, then the pitch can be smaller for a given illumination wavelength, compared to embodiments using first (or higher) order scattered radiation. The grating quality value in this example was determined in the pupil plane using sensor 19, although the dark field image plane sensor 23 may also be used, with a suitable aperture to select the zeroth order.

It is found that GQ versus CD bias has a similar, generally parabolic, behavior as 1st (or higher) order diffraction intensity, as described with reference to Figured 6 and 7. Thus FIGS. 6 and 7 can validly be redrawn with GQ replacing DI, as shown in FIGS. 16 and 17.

FIG. 16 is a graph of grating quality signal GQ versus CD bias. The inventors have found that a generally parabolic curve of grating quality vs. CD (160 nm to 250 nm with 10 nm a step, and pitch of 400 nm) can be obtained. In this example, the peak grating quality signal occurs at CD of 200 nm, i.e. at a 1:1 line-to-space ratio.

FIG. 17 is a graph of gradient of grating quality signal with respect to CD, $\Delta GQ/\Delta CD$, versus CD. $\Delta GQ/\Delta CD$ is calculated by taking the difference, $\Delta GQ$, between the measured grating quality signal for each pair of CD biases (e.g. CD1, CD2 or CD4, CD3 or CD3, CD1) and dividing by the difference in CD bias, $\Delta CD$, between each of the respective pairs of CD biases. The gradient of the curve of grating quality signal versus CD shown in FIG. 16 is increasing linearly to more negative values towards larger CD and to more positive towards smaller CD. The slope of the curve of grating quality signal versus CD is zero at peak grating quality signal, CD=200 nm.

By measuring the grating quality signal gradient, the CD can be extracted when a set of CD targets with known on-wafer CD biases are used. When three or more biases are used, then the CD can be extracted directly from the measurements. When a calibration step is used, then the CD can be extracted directly from the measurements of targets with just two biases.

For example, with reference to FIG. 16, CD1=230 nm and CD2=240 nm (by design). The gradient of grating quality signal is at position A, as shown in FIG. 17. The point A is labeled CD1, CD2 to indicate the source of the grating quality signal measurements used to calculate the gradient at point A. When exposure dose increases, both CD1 and CD2 targets will move to smaller CDs, say CD1=220 nm and CD2=230 nm. The gradient of grating quality signal then becomes smaller, shifting to position B, as shown in FIG. 17.

Note that, as a result of the differential data analysis, the impact of underlying stack variation will be very small at the working point ($\Delta GQ/\Delta CD=0$), under normal process conditions.

Note also that no reconstruction recipe is needed. A calibration of CD versus differential GQ signal may be used, once per process stack. During recipe setup, a CD-SEM can be used as reference tool for the calibration.

FIG. 18 is a flow chart of a method in accordance with an example embodiment using measurement of intensity of zeroth order scattered radiation, having the following steps (with the steps in common with FIGS. 8 and 13 labeled accordingly) (which may not be performed in the order shown or require all the steps):

Step 1300: In order to use just two critical dimension biases in steps 1802 to 1810, a calibration step is needed.

This calibration step may be performed as described in steps 1000 and 1001 with reference to FIG. 10. This calibration step may use three CD biases. The calibration step may use measurements on a "golden wafer" (i.e. a reference wafer) to determine the intensity gradient for each of the CD pairs, with known CDs. Alternatively, the calibration can be based upon simulation of the sensitivity of intensity gradient to CD.

Step 802: Process wafer using lithography apparatus in the lithographic process to produce targets with different respective critical dimension biases on wafer. A target pair which contains line/space with opposite CD biases on the reticle may be used. The target size can be small, e.g. 2×10×10 µm2.

Step 1804: Illuminate each of the targets using at least two different polarization directions with respect to the direction of periodicity.

Step 1806: Measure intensity of 0th order radiation scattered by the targets for the different polarization directions. A scatterometer where the scattered light is measured in the image plane may be used. Optimally a part of the angular reflection is selected by an aperture in the pupil plane in the illumination and/or the measurement branch. The reflected intensity of the targets are measured in the image plane, subsequently with two polarization directions (TE,TM).

Step 806: Recognize & extract each grating ROI from each or the image.

Step 1810: Determine a differential signal. The differential signal may be determined based on a difference between measured intensity for the different polarization directions. This "double-differential" signal may thus be determined as [(TE−TM)_target2−(TE−TM)_target_1]. Then the CD-related property, such as CD or exposure dose, is determined based on the differential signal, the CD biases and knowledge that the differential signal approximates to zero at a 1:1 line-to-space ratio of such periodic targets and (if only two critical dimension biases are being used) using the calibrated response of the differential signal to the CD-related property. The critical-dimension-related property may be determined based on the measured intensity and the critical dimension biases and based on the difference between refractive index in the direction of periodicity and an orthogonal direction having a maximum at a 1:1 line-to-space ratio of such periodic targets.

Step 812: Use the determined critical-dimension-related property to control the lithography apparatus in the lithographic processing of subsequent wafers.

FIG. 19 depicts an overview of determination of a double differential of grating quality. As before CD1 and CD3 represent gratings with different CD biases. AP represents the process variation (that affects CD) that is common to both gratings CD1 and CD3.

The methods described herein do not need the tedious setup of a reconstruction model/recipe (including details of material properties like refractive indices n and k, etc.). The methods described herein are much faster than reconstruction and can be applied on small targets. There is no fundamental limit to the smallest pitch when using zeroth order scattered radiation.

The example embodiments described with reference to FIGS. 14 to 19 comes at the cost of taking two images (TE/TM) instead of one, but in most scatterometers, the polarization can be changed very fast.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a critical-dimension-related property of a structure produced by a lithographic process, the method comprising:
   illuminating with radiation each of at least two periodic targets with different respective critical dimension biases;
   measuring respective intensities of radiation scattered by the at least two targets;
   determining a differential signal from the measured intensities; and
   determining the critical-dimension-related property based on calculations using a value of the differential signal and using values of the at least two critical dimension biases, wherein the differential signal approximates to zero at a 1:1 line-to-space ratio of such periodic targets.

2. The method of claim 1, wherein the measuring intensity of radiation comprises measuring intensity of at least one non-zero order of scattered radiation.

3. The method of claim 1, wherein the illuminating comprises using at least two different polarization directions of illumination radiation with respect to a direction of periodicity of the periodic targets, the measuring intensity of radiation comprises measuring intensity of zeroth order scattered radiation for each of the polarization directions and the determining a differential signal from the measured intensities is based on a difference between measured intensity for the different polarization directions.

4. The method of claim 1, wherein the illuminating comprises illuminating at least three targets with different respective critical dimension biases, the measuring intensity of radiation comprises measuring at least three respective intensities and the determining the critical-dimension-related property is based on calculations using values of the at least three critical dimension biases.

5. The method of claim 1, further comprising a calibration to determine a response of the differential signal to the critical-dimension-related property by determining a differential signal from measured respective intensities of radiation scattered by at least two targets with known critical dimensions.

6. The method of claim 1, further comprising a calibration to determine a response of the differential signal to the critical-dimension-related property by simulation of sensitivity of the differential signal to critical dimension.

7. A method of manufacturing devices wherein a device pattern is applied to a series of substrates using a lithographic process, the method including determining a critical-dimension-related property of a structure produced by the lithographic process using at least one of the substrates and using a method as claimed in claim 1, and controlling the lithographic process for later substrates in accordance with the result of the method of determining the critical-dimension-related property.

8. An inspection apparatus to determine a critical-dimension-related property of a structure produced by a lithographic process, the inspection apparatus comprising:
   an illumination system configured to illuminate with radiation each of at least two periodic targets with different respective critical dimension biases;
   a detection system configured to measure respective intensities of radiation scattered by the at least two targets; and
   a processor configured to determine a differential signal from the measured intensities and to determine the critical-dimension-related property based on calculations using a value of the differential signal and using values of the at least two critical dimension biases, wherein the differential signal approximates to zero at a 1:1 line-to-space ratio of such periodic targets.

9. The inspection apparatus of claim 8, wherein the detection system is configured to measure intensity of radiation by measuring intensity of at least one non-zero order of scattered radiation.

10. The inspection apparatus of claim 8, wherein the illumination system is configured to use at least two different polarization directions of illumination radiation with respect to a direction of periodicity of the periodic targets, the detection system is configured to measure intensity of radiation by measuring intensity of zeroth order scattered radiation for each of the polarization directions and the processor is configured to determine a differential signal from the measured intensities based on a difference between measured intensity for the different polarization directions.

11. The inspection apparatus of claim 8, wherein the illumination system is configured to illuminate at least three targets with different respective critical dimension biases, the detection system is configured to measure at least three respective intensities and the processor is configured to determine the critical-dimension-related property based on calculations using values of the at least three critical dimension biases.

12. The inspection apparatus of claim 8, wherein the processor is configured to determine the critical-dimension-related property using a calibrated response of the differential signal to the critical-dimension-related property.

13. The inspection apparatus of claim 8, wherein the processor is configured to determine the critical-dimension-related property using a simulated response of the differential signal to the critical-dimension-related property.

14. A non-transitory computer-readable medium comprising instructions configured to cause a processor to at least:
   obtain a differential signal from measured respective intensities of radiation scattered by each of at least two targets having different respective critical dimension biases; and
   determine a critical-dimension-related property of a structure produced by a lithographic process based on calculations using a value of the differential signal and using values of the at least two critical dimension biases, wherein the differential signal approximates to zero at a 1:1 line-to-space ratio of such periodic targets.

15. The non-transitory computer-readable medium of claim 14, wherein the measured intensity of radiation is of at least one non-zero order of scattered radiation.

16. The non-transitory computer-readable medium of claim 14, wherein the measured intensities are of zeroth order scattered radiation for each of at least two polarization directions of illumination radiation with respect to a direction of periodicity of the periodic targets and the differential signal is based on a difference between measured intensity for the different polarization directions.

17. The non-transitory computer-readable medium of claim 14, wherein the measured intensities are of at least three targets with different respective critical dimension biases and the determination of the critical-dimension-related property is based on calculations using values of the at least three critical dimension biases.

18. The non-transitory computer-readable medium of claim 14, wherein the instructions are further configured to determine the critical-dimension-related property using a calibration determined from a differential signal obtained from measured respective intensities of radiation scattered by at least two targets with known critical dimensions.

19. The non-transitory computer-readable medium of claim 14, wherein the instructions are further configured to determine the critical-dimension-related property using a calibration determined by simulation of sensitivity of the differential signal to critical dimension.

20. The non-transitory computer-readable medium of claim 14, wherein the instructions are further configured to determine the critical-dimension-related property using a simulated response of the differential signal to the critical-dimension-related property.

21. The non-transitory computer-readable medium of claim 14, wherein the instructions are further configured to determine the critical-dimension-related property using a calibrated response of the differential signal to the critical-dimension-related property.

* * * * *